United States Patent [19]
Nishizawa et al.

[11] Patent Number: 5,355,235
[45] Date of Patent: Oct. 11, 1994

[54] ORGANIC FIELD EFFECT ELEMENT HAVING ORGANIC LAYERS WITH DIFFERENT CARRIER CONCENTRATIONS

[75] Inventors: Hideyuki Nishizawa; Shuichi Uchikoga; Yoshihiko Nakano, all of Tokyo; Shuzi Hayase, Kawasaki, all of Japan

[73] Assignee: Kabushiki Kaisha Toshiba, Kawasaki, Japan

[21] Appl. No.: 928,704

[22] Filed: Aug. 13, 1992

[30] Foreign Application Priority Data

Aug. 15, 1991 [JP] Japan .................. 3-205286

[51] Int. Cl.⁵ ............... G02F 1/133; H01L 29/784
[52] U.S. Cl. ...................... 359/59; 257/40; 257/607; 257/642
[58] Field of Search ............. 359/59, 79, 87; 257/40, 257/405, 410, 411, 607, 642; 345/92

[56] References Cited

U.S. PATENT DOCUMENTS

| | | | |
|---|---|---|---|
| 4,873,556 | 10/1989 | Hyodo et al. | 257/40 |
| 5,107,308 | 4/1992 | Koezuka et al. | 257/40 |
| 5,153,681 | 10/1992 | Kishimoto et al. | 257/40 |
| 5,206,525 | 8/1993 | Yamamoto et al. | 257/40 |

FOREIGN PATENT DOCUMENTS

4069971  3/1992  Japan ............... 257/40

OTHER PUBLICATIONS

Patent Abstracts of Japan, vol. 14, No. 16 (E-872), Jan. 12, 1990, & JP-A-12 59 563, Oct. 17, 1989, Tsumura Akira, et al., "Field Effect Transistor".

Japanese Journal of Applied Physics, vol. 19, No. 5, 1980, 225–227, T. Mimura, et al. "A New Field-Effect Transistor with Selectively Doped GaAs/n-Alx-Ga1-xAs Heterojunctions."

Applied Physics Letters, vol. 49, No. 18, pp. 1210–1212, 1986, A. Tsumura, et al. "Macromolecular Electronic Device: Field-Effect Transistor with a Polythiophene Thin Film."

*Primary Examiner*—William L. Sikes
*Assistant Examiner*—Tai V. Duong
*Attorney, Agent, or Firm*—Oblon, Spivak, McClelland, Maier & Neustadt

[57] ABSTRACT

There is disclosed an organic field effect element having an large ON/OFF current ratio. The organic field effect element includes a source electrode and a drain electrode formed separately to each other, a first organic layer constituting a channel between the source and drain electrodes, a second organic layer formed to be adjacent to the channel and having a carrier concentration different from that of the first organic layer, and a gate electrode formed to be opposite to the channel through the second organic layer. Carriers are transferred between the second and first organic layers in response to a voltage applied to the gate electrode to change an electrical conductivity of the channel.

16 Claims, 4 Drawing Sheets

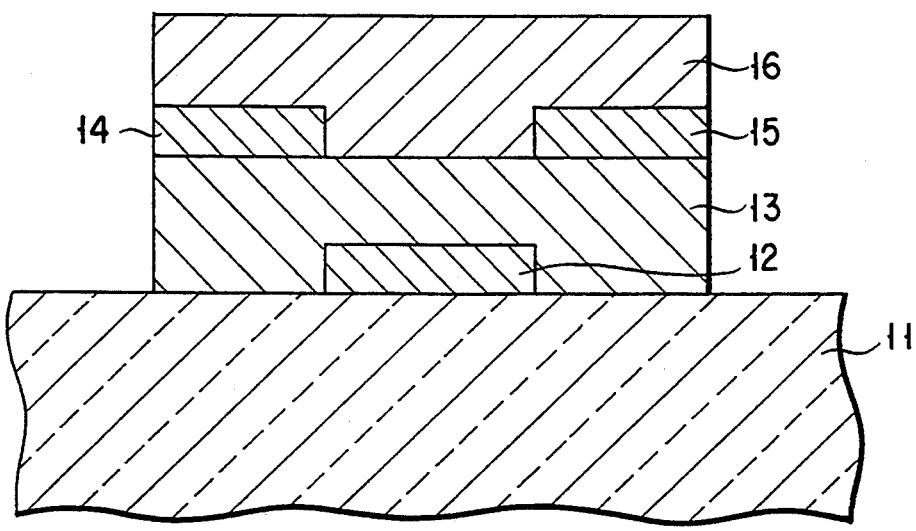
F I G. 3

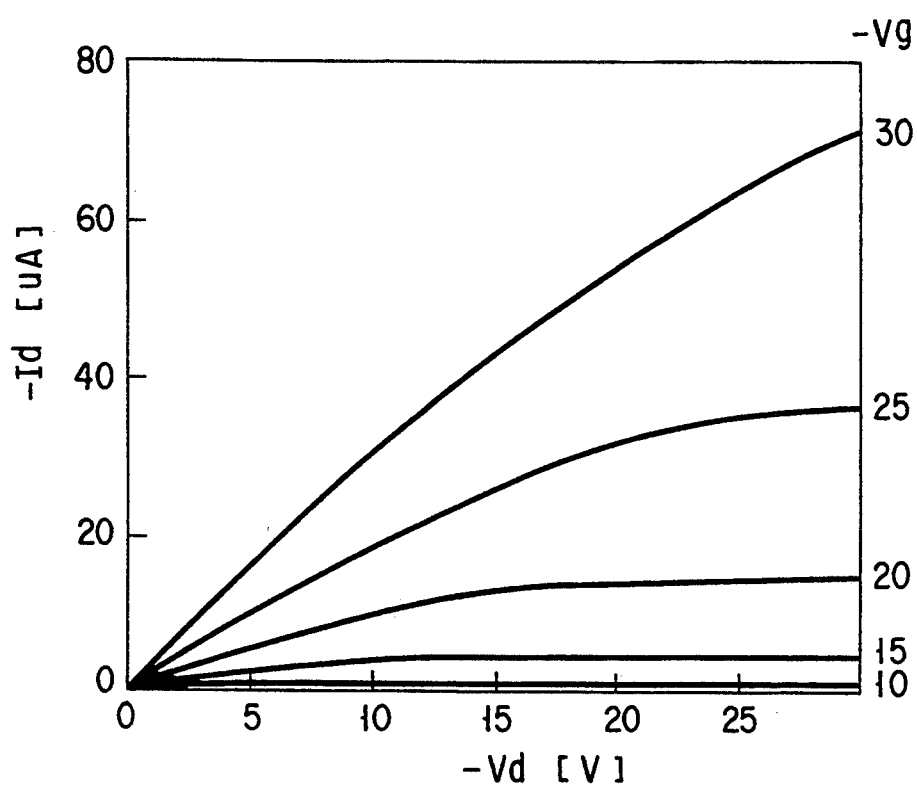
F I G. 4
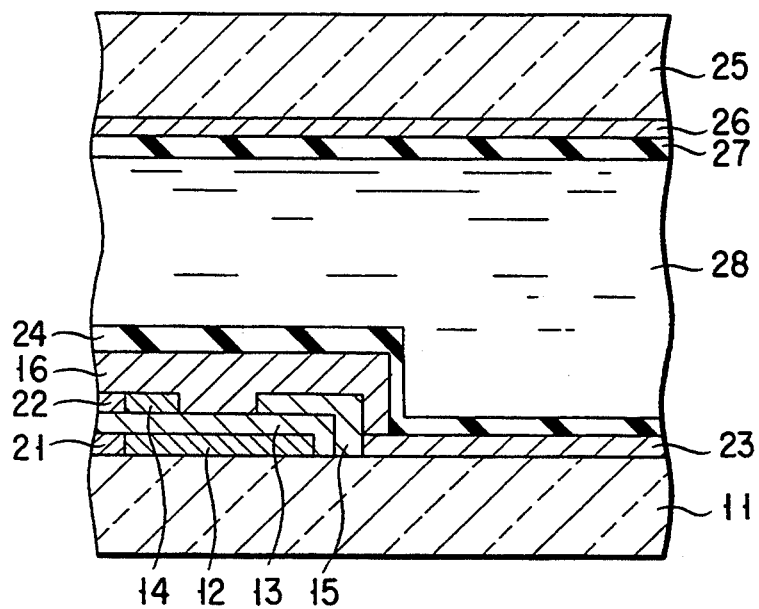
F I G. 5

ORGANIC FIELD EFFECT ELEMENT HAVING ORGANIC LAYERS WITH DIFFERENT CARRIER CONCENTRATIONS

BACKGROUND OF THE INVENTION

1. Field of the Invention

The present invention relates to an organic field effect element using an organic material.

2. Description of the Related Art

Conventional organic field effect elements using organic materials are described in, e.g., Published Unexamined Japanese Patent Application Nos. 61-202469, 63-14471, 63-14472, 1-89368, 1-259563, and 1-259564. These elements will be described below with reference to FIG. 1.

A gate electrode 2 is formed on a substrate 1, an insulating film 3 is formed to cover the entire surface of the gate electrode 2. As the insulating film, an oxide film or a polymer film such as a polysiloxane film is used. A source electrode 4 and a drain electrode 5 are formed separately to each other on the insulating thin film 3, and a semiconductor layer 6 consisting of a $\pi$-conjugated polymer is formed to constitute a channel region between the source and drain electrodes 4, 5.

The operative principle of the organic field effect element in FIG. 1 will be described below. A current flowing in the channel is determined by a potential difference between the source and the drain electrodes 4, 5 and the resistance of the channel. In this case, the resistance of the channel is determined by the electric resistance of the $\pi$-conjugated polymer when no voltage is applied to the gate electrode 2. On the other hand, when a voltage is applied to the gate electrode 2, carriers in the $\pi$-conjugated polymer are attracted to and accumulated in the channel, thereby decreasing the resistance of the channel. In this manner, the current flowing in the channel can be controlled by the potential of the gate electrode 2 (e.g., A. Tsumura et al., Synthetic Metals, Vol. 25, pp. 11–23).

A field effect element is required to have the following characteristics. That is, a current (to be referred to as an ON current hereinafter) obtained when a voltage is applied to the gate electrode is large, and a ratio of the ON current to a current (to be referred to as an OFF current hereinafter) obtained when no voltage is applied to the gate electrode is large.

In a conventional organic field effect element, in order to increase an ON current, the carrier mobility in a channel must be increased, or the number of carriers accumulated in the channel must be increased. However, when the carrier mobility in the channel is increased, an OFF current is also increased. In addition, in order to increase the number of carriers accumulated in the channel without an increase in voltage applied to the gate electrode, the number of carriers in a $\pi$-conjugated polymer must be increased. However, also in this case, an OFF current is increased. Therefore, in order to increase the ON current and to decrease the OFF current, a new means is required at present.

The above point is important when a field effect element is applied to particle use. As an example of an application of a field effect element, an active matrix-type drive circuit in a liquid crystal display is known. In this liquid crystal display, a field effect element is formed to each pixel, and a drain electrode and the pixel electrode are connected to each other, thereby controlling signal voltages applied to the pixel electrode by a gate electrode. The active matrix is better than a simple matrix. That is, the active matrix has a smaller leakage signal between pixels and higher image quality such as contrast, resolution, and pixel density than those of the simple matrix. In a conventional active matrix, a field effect element having an inorganic semiconductor thin film, such as amorphous silicon, has been used (e.g., Kaichi Fukuda et al., The Transactions of the Institute of Electrical Engineers of Japan, Vol. 110-A, No. 10, pp. 659–666 (1990)). Also in a field effect element used in the active matrix, in order to obtain a liquid crystal display having high quality such as a high contrast, a high resolution, and a high pixel density, an ON current must be increased, and an OFF current must be decreased, i.e., an ON/OFF current ratio must be increased. In addition, in order to increase a response of the liquid crystal display, the ON current must be increased (Masakiyo Matsumura et al., The Transactions of the Institute of Electrical Engineers of Japan, Vol. 110-A, No. 10, pp. 657–658 (1990)).

In recent years, there exists a demand for a liquid crystal display having a large area, and thus a glass or plastic substrate having a large area on which field effect elements are largely integrated has been required. However, it is very difficult to form an inorganic semiconductor such as an amorphous silicon into a thin film having a large area with uniform quality. In addition, since the substrate must be heated to 200° C. or more in the process of manufacturing the inorganic semiconductor thin film, a plastic substrate cannot be used. Furthermore, the inorganic semiconductor thin film has a drawback that it is easily cracked by shock or expansion and contraction caused by heat resulting in poor reliability.

In order to solve the above problems, there is proposed an active matrix-type liquid crystal display using an organic field effect element having a $\pi$-conjugated polymer thin film in place of an inorganic semiconductor thin film (e.g., Published Unexamined Japanese Patent Application Nos. 62-85224 and 1-259323). Since such an organic field effect element has advantages as compared with a field effect element using an inorganic semiconductor thin film, it is very important to increase an ON current to increase an ON/OFF current ratio. However, in the conventional organic field effect element, it is disadvantageously difficult to increase an ON current to increase an ON/OFF current ratio as above-described.

SUMMARY OF THE INVENTION

It is an object of the present invention to provide an organic field effect element having a large ON current and a large ON/OFF current ratio.

According to the present invention, there is provided an organic field effect element comprising a source electrode and a drain electrode formed separately to each other, a first organic layer constituting a channel between the source and drain electrodes, a second organic layer formed to be adjacent to the channel and having a carrier concentration different from that of the first organic layer, and a gate electrode formed to be opposite to the channel through the second organic layer, wherein carriers are transferred between the second and first organic layers in response to a voltage applied to the gate electrode to change an electrical conductivity of the channel.

The organic field effect element of the present invention has a structure, for example, in which the gate electrode is formed on the substrate, the second organic layer is formed to cover the entire surface of the gate electrode, the source and drain electrodes are formed on the second organic layer with a predetermined space, and the first organic layer is formed on the source electrode, the drain electrode, and the second organic layer between the source and drain electrodes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a sectional view showing an organic field effect element according to Example 1 of the present invention;

FIG. 4 is a graph showing a relationship between a potential Vd of a drain electrode with respect to a source electrode and a current Id flowing in the drain electrode using a potential Vg of a gate electrode with respect to the source electrode as a parameter;

FIG. 5 is a sectional view showing a liquid crystal display using the organic field effect element in Example 1;

DETAILED DESCRIPTION OF THE PREFERRED EMBODIMENTS

Figure 1:
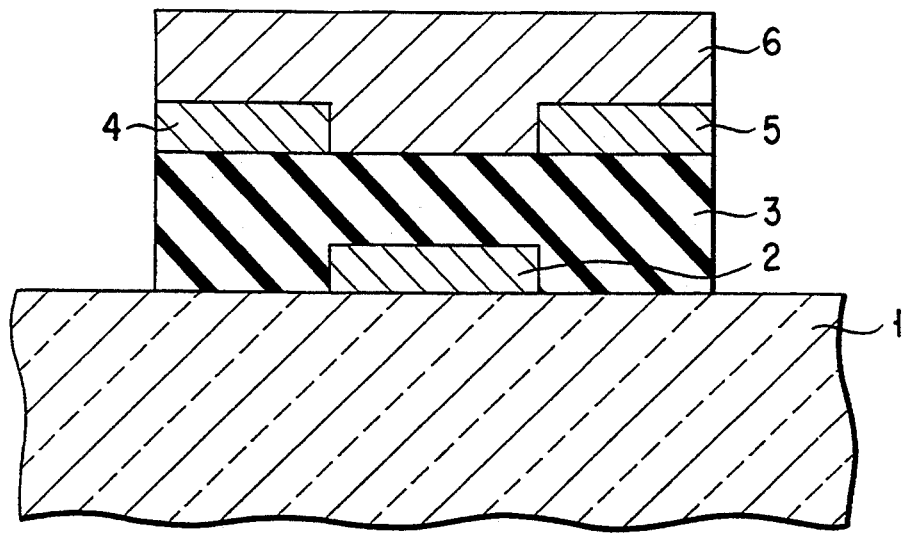
FIG. 1 is a sectional view showing a conventional organic field effect element.

In the present invention, any insulating material may be used as a substrate.

In the present invention, as materials for a first organic layer constituting a channel and a second organic layer formed to be adjacent to the channel, a $\pi$-conjugated polymer, a $\sigma$-conjugated polymer, and derivatives thereof are used. Examples of the $\pi$-conjugated polymer are polyparaphenylene, polyacetylene, polypyrrole, polythiophene, polyfuran, polyselenophene, polyaniline, polyazulene, polypyrene, polyfluorene, polyparaphenylenevinylene, polythienylenevinylene, polybenzofuran, polybenzothiophene, polyindole, polyvinylcarbazole, polydibenzofuran, polyisothianaphthene, polyisonaphthothiophene, polydiacethylene, polyphenylenesulfide, and polyphenyleneoxide. Examples of the $\sigma$-conjugated polymer are polysilane and polygermane.

As methods of forming the first and second organic layers, deposition, electrochemical polymerization, photo-irradated electrochemical polymerization, gas-phase polymerization, a method in which a prepolymer is polymerized by heat or a catalyst, and a method in which a polymer is dissolved in a solvent to be coated and dried are used.

In the present invention, the second organic layer has a carrier concentration different from that of the first organic layer, e.g., the second organic layer has a carrier concentration higher than that of the first organic layer in a dark state or a light irradiation state. The carrier concentration of the second organic layer becomes higher than that of the first organic layer, for example, by doping a dopant. As a method of doping the dopant in the second organic layer, the following methods are used, in which the layer is exposed to a doping vapor in the atmospheric pressure, the layer is exposed to a doping vapor at a reduced pressure, the layer is electrochemically doped in a solution containing a dopant, a dopant is brought into contact with the second organic layer to be thermally diffused, and a dopant is ion-implanted in the layer.

When electrons are used as carriers, examples of the dopant are halogens (e.g., $I_2$, $Cl_2$, $Br_2$, $ICl$, $ICl_3$, $IBr$, and $IF$), Lewis acids (e.g., $PF_5$, $AsF_5$, $SbF_5$, $BF_3$, $BCl_3$, $BBr_3$, and $SO_3$), protonic acids, organic acids, or amino acids (e.g., $HF$, $HCl$, $HNO_3$, $H_2SO_4$, $HClO_4$, $FSO_3H$, $ClSO_3H$, and $CF_3SO_3H$), transition metal compounds (e.g., $FeCl_3$, $FeOCl$, $TiCl_4$, $ZrCl_4$, $HfCl_4$, $NbF_5$, $NbCl_5$, $TaCl_5$, $MoF_5$, $MoCl_5$, $WF_6$, $WCl_6$, $UF_6$, and $LnCl_3$ (Ln is a lanthanoid)), anions (e.g., $Cl^-$, $Br^-$, $I^-$, $ClO_4^-$, $BF_4^-$, $PF_6^-$, $AsF_6^-$, $SbF_6^-$, and anions of various sulfonic acids). When holes are used as carriers, examples of the dopant are cations (e.g., $H^+$, $Li^+$, $Na^+$, $K^+$, $Rb^+$, and $Cs^+$), alkali metals (e.g., Li, Na, K, Rb, and Cs), alkaline-earth metals (e.g., Ca, Sr, and Br), $O_2$, $XeOF_4$, $(NO_2^+)(SbF_6^-)$, $(NO_2^+)(SbCl_6^-)$, $(NO_2^+)(BF_4^-)$, $AgClO_4$, $H_2IrCl_6$, $La(NO_3)_3 \cdot 6H_2O$, $FSO_2OOSO_2F$, Eu, acetylcholine, $R_4N^+$ (R is an alkyl group), $R_4P^+$ (R is an alkyl group), $R_6As^+$ (R is an alkyl group), and $R_3S^+$ (R is an alkyl group). At this time, the carrier concentration N of the second organic layer preferably satisfies a condition of $N > 55,000 \, \epsilon/d^2$, where d and $\epsilon$ represent the thickness and permitivity of the second organic layer, respectively. This is because, when the carrier concentration is too low, a current flowing in a channel may not be easily controlled by the potential of a gate electrode.

In the present invention, the second organic layer may have a stacked structure. For example, the second organic layer may be formed by a stacked structure consisting of a charge generation layer and a charge transport layer. In this case, when the charge generation layer constituting the second organic layer is irradiated with light, carriers are generated and transport through the charge transport layer, so that the carrier concentration of the second organic layer becomes higher than that of the first organic layer.

Any material which absorbs light and efficiently generates carriers may be used as a material constituting the charge generation layer. Examples of the materials are inorganic photoconductors (e.g., selenium, a selenium alloy, CdS, CdSe, CdSSe, ZnO, and ZnS), various crystalline metallic phthalocyanine pigments (e.g., titanylphthalocyanine and vanadylphthalocyanine), various crystalline non-metallic phthalocyanine pigments, azo dyes (e.g., a monoazo dye, a bisazo dye, a trisazo dye, and a tetrakisazo dye), penylene pigments (e.g., penylene anhydride and penylene imide), polycyclic quinon pigments (e.g., a perynone pigment, an indigoid dye, a quinacridone pigment, anthraquinone, and dibromoanthoanthrone), aggregate complexes (consisting of a cyanine dye, a xanthene dye, a pyrinium dye, or a thiapyrinium die and a polycarbonate resin, a charge-transfer complex (consisting of an electron-donor material such as an azulenium dye, a squalinium dye, and poly-N-carbazole and an electron-acceptor material such as trinitrofluorenone.

The charge generation layer may consist of only a charge generating material or may consist of the charge generating material and a binder polymer. As the binder polymer, a polyvinylbutyral resin, a phenoxy resin, or the like is used. As a method of forming the charge generation layer, a coating method (e.g., a spin coating method, an immersion pulling method, a roller coating method, a doctor blade method, and a spray method), a vacuum deposition method, a sputtering method, a plasma CVD method using glow discharge, or the like is used. A proper method is selected from these methods in accordance with the type of a charge generating material to be used.

As a material constituting the charge transport layer, the above $\pi$-conjugated polymer, $\sigma$-conjugated polymer, and derivatives thereof can be used. As a method of forming the charge transport layer consisting of these materials, a deposition method, an electrochemical polymerization, a photo-irradiated electrochemical polymerization, a gas-phase polymerization, a method of polymerizing a prepolymer by heat or a catalyst, a method in which a polymer is dissolved in an appropriate solvent to be coated and dried, or the like is used.

Another examples of the material constituting the charge transport layer are a hydrazone compound, a pyrazoline compound, an oxadiazole compound, a thiazole compound, a thiadiazole compound, a ketazine compound, an enamine compound, an anisidine compound, a stilbene compound, a butadiene compound, a carbazole compound, and polymer compounds obtained by introducing residual groups thereof to the main or side chains of polymers.

The charge transport layer consisting of these materials is formed as follows. A binder polymer is dissolved in an appropriate organic solvent, and the above charge transporting material is dissolved or dispersed in the organic solvent to prepare a coating liquid. This coating liquid is coated by a normal coating method and dried. As the coating method, a spin coating method, an immersion pulling method, a roller coating method, a doctor blade method, or a spray coating method is used.

In this case, examples of the binder polymer are polycarbonate, polyester, polyester carbonate, polyvinyl chloride, an acrylic resin, polyvinyl acetate, a vinyl chloride-vinyl acetate copolymer, polyvinyl acetal, a phenolic resin, a styrene-acrylic copolymer, polyarylate, an alkyd resin, or a phenoxy resin. When the charge transporting material can be formed into a film, a binder polymer is not necessarily required. When the binder polymer is used, a mixing ratio of the charge transporting material to the binder polymer is preferably set to be 1 part by weight:0.3 to 2 parts by weight.

In the present invention, as a material for a gate electrode, a material which can form a Schottky junction or a heterojunction with the second organic layer is preferably used. As the material, a metal, a conductive oxide, a semiconductor such as Si treated to decrease its resistance, the above $\pi$-conjugated polymer, the $\sigma$-conjugated polymer, or the derivative of the $\pi$-conjugated polymer or the $\sigma$-conjugated polymer is used.

When the second organic layer and the gate electrode do not easily form the above junction, an insulating layer may be formed between the second organic layer and the gate electrode. If the insulating layer is formed when the junction is not easily formed, carriers in the gate electrode are prevented from being injected in the second organic layer. As a result, the second organic layer is depleted, and the carriers can be effectively injected in the first organic layer.

In the present invention, the material for the source and drain electrodes may be the same or different. As the materials of the source and drain electrodes, materials which can form a Schottky junction or a heterojunction with the second organic layer are preferably used. As the material, similar to the gate electrode, a metal, a conductive oxide, a semiconductor such as Si treated to decrease its resistance, the above $\pi$-conjugated polymer, the $\sigma$-conjugated polymer, or the derivative of the $\pi$-conjugated polymer or the $\sigma$-conjugated polymer is used. When the source and drain electrodes do not easily form the above junction with the second organic layer, an insulating layer may be formed between the source and drain electrodes and the second organic layer. If the insulating layer is formed when the junction is not easily formed, short circuit between the source and drain electrodes through the second organic layer can be prevented. Note that a space between the source and drain electrodes can be arbitrarily set.

When an organic field effect element according to the present invention is applied to a liquid crystal display, element structures other than the field effect element are the same as those of the general liquid crystal display.

Although any insulator can be used as a substrate material, a substrate material on the side through which light passes or on which the light is incident must be transparent within the wavelength region of the light.

As the materials of a pixel electrode, an address line, a data line, and a counter electrode, a metal, a conductive oxide, a semiconductor such as Si treated to decrease its resistance, the above $\pi$-conjugated polymer, the $\sigma$-conjugated polymer, or the derivative of the $\pi$-conjugated polymer or the e-conjugated polymer is used. A part which is in contact with the liquid crystal must consist of an insoluble material in the liquid crystal. In addition, the material for the part on the side through which light passes or on which the light is incident must be transparent within the wavelength region of the light.

As the liquid crystal, a guest-host liquid crystal, a TN liquid crystal, or a smetic C-phase liquid crystal is used.

The operative principle of an organic field effect element according to the present invention will be described below.

When a voltage is not applied to a gate electrode, injection of only a small number of carriers is caused by an electric field on an interface between a second organic layer and a first organic layer constituting a source-drain channel. At this time, if an organic field effect element has a second organic layer having a carrier concentration higher than that of the first organic layer, the channel has a high resistance, and a current flowing in the channel is very small.

When a voltage is applied to the gate electrode to repel the carriers in the second organic layer from the gate electrode, a large number of carriers are injected in the first organic layer from the second organic layer. For this reason, the resistance of the channel is considerably decreased, and a current flowing in the channel can be increased.

When a voltage is applied to the gate electrode such that the carriers in the second organic layer are attracted to the gate electrode, a large number of carriers are injected in the second organic layer from the first organic layer. In this case, since the resistance of the channel becomes higher than that obtained when no voltage is applied to the gate electrode, a current flowing in the channel can be decreased.

The same operative principle as described above is obtained when the second organic layer has a stacked structure consisting of a charge generation layer and a charge transport layer and when light is irradiated on the second organic layer to generate carriers.

Figure 2A:
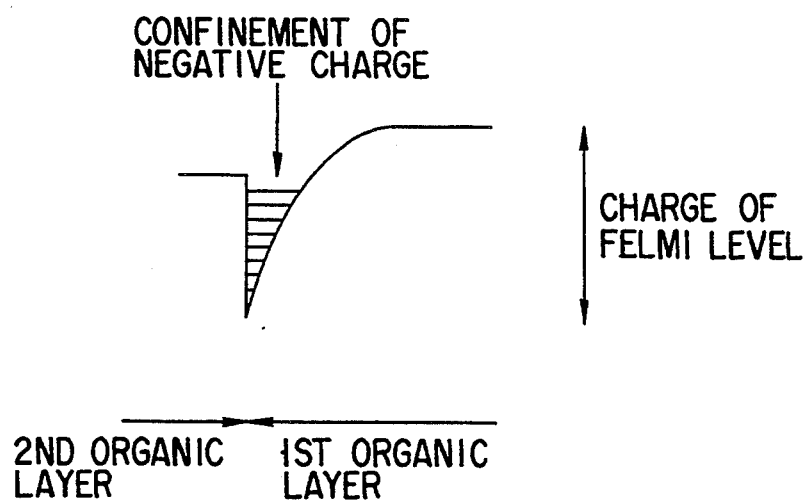
FIG. 2A is an energy band diagram for explaining confinement of negatively charged carriers on an interface between the first and second organic layers following a change in Fermi level caused by transition of the first organic layer to a metallic state in the organic field effect element according to the present invention.
Figure 2B:
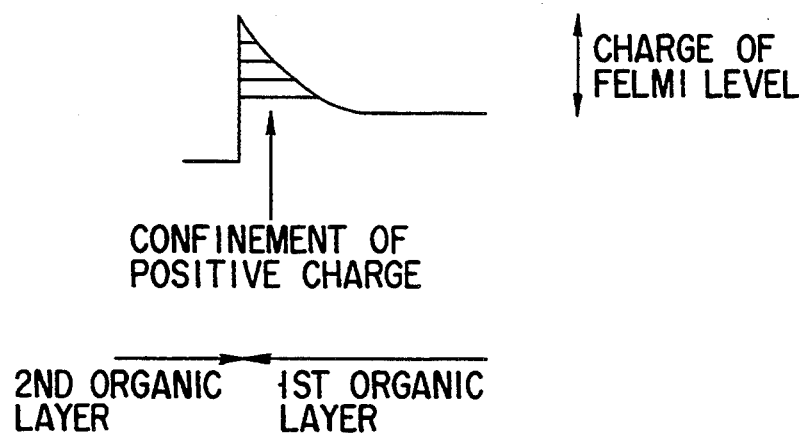
FIG. 2B is an energy band diagram for explaining confinement of positively charged carriers on an interface between the first and second organic layers following a change in Fermi level caused by transition of the first organic layer to a metallic state in the organic field effect element according to the present invention.

In a $\pi$-conjugated polymer, a $\sigma$-conjugated polymer, or derivatives thereof, there are carriers in a state called polaron or bipolaron which is a dimer of the polaron. The polaron has two separated energy bands. When the number of carriers is small, a Fermi level is located at almost the center of the two bands, and the organic layer remains an insulator. When the number of carriers is increased in these energy bands, negative charges and positive charges move in a high-level (close to a vacuum level) polaron band and a low-level polaron band, and the Fermi level shifts into their polaron bands respectively, and the organic layer is changed from an insulating or semiconductor state to a metallic state, thereby considerably decreasing the resistance of the organic layer (e.g., A. J. Heeger et al., Reviews of Modern Physics, vol. 60, pp. 781–850 (1988); Avadh Saxena et al., Physical Review B, Vol. 35, pp. 3914–3928 (1987); M. A. Abkowitz et al., Philosophical Magazine B, Vol. 61, pp. 25–57 (1990); and Betts et al., Solid State Communications, Vol. 74, pp. 461–464 (1990)). Therefore, when these conjugated polymers are used for the first organic layer, and a sufficient number of carriers are injected from the second organic layer, the first organic layer becomes a metallic state. As shown in FIG. 2A (when carriers are negatively charged) and FIG. 2B (when carriers are positively charged), a change in Fermi level when the state of the first organic layer is changed into the metallic state bends the band of the first organic layer, and carriers are confined in the interface between the first and second organic layers. In this interface, a metallic layer in which carriers are two-dimensionally spread is formed, and a current flowing in the channel is greatly increased.

As described above, in an organic field effect element according to the present invention, an ON current can be increased to increase an ON/OFF current ratio.

EXAMPLES

Examples of the present invention will be described below with reference to the accompanying drawings.

Example 1

FIG. 3 is a sectional view showing an organic field effect element in Example 1. A gate electrode 12 is formed on a glass substrate 11, and a second organic layer 13 is formed to cover the entire surface of the gate electrode 12. A source electrode 14 and a drain electrode 15 are separately formed on the second organic layer 13, and a first organic layer 16 is formed to constitute a channel between the source electrode 14 and the drain electrode 15.

This organic field effect element was manufactured as follows. Polyparaphenylene used for the second organic layer and a prepolymer of polyparaphenylenevinylene used for the first organic layer were synthesized in advance. The polyparaphenylene was synthesized by a method described in Takakazu Yamamoto et al., Chemistry Letters, pp. 1211–1214 (1990) such that para-dibromobenzene was condensed in the presence of Mg and Ni complex catalysts. The prepolymer of the polyparaphenylenevinylene was synthesized such that a sulfonium salt obtained by a reaction between dialkylesulfide and paraxylylene dihalide was polymerized using a basic catalyst.

This prepolymer will be converted into polyparaphenylenevinylene by a thermal polymerizing method described by D. D. C. Bradley, Journal of Physics D: Applied Physics, vol. 20, pp. 1389–1410 (1987).

An Al layer prospectively serving as the gate electrode 12 was formed on the glass substrate 11 by vacuum deposition, and then the polyparaphenylene was placed in a tantalum boat and heated at 240° C. under $10^{-4}$ Pa to be deposited, thereby forming the second organic layer 13 having a thickness of 200 nm on the gate electrode 12. A metal mask was fixed on the second organic layer 13, and Ni was vacuum-deposited, thereby forming the source electrode 14 and the drain electrode 15. The space between the source electrode 14 and the drain electrode 15 was set to be 100 $\mu$m. The resultant structure was exposed to an iodine vapor using the source electrode 14 and the drain electrode 15 as masks to dope $I_2$ serving as a dopant in the second organic layer 13. As a result, the carrier concentration in the second organic layer 13 became $1 \times 10^{16}/cm^3$. After a solution of the prepolymer of polyparaphenylenevinylene was cast on the source electrode 14, the drain electrode 15, and the second organic layer 13 by a spinner, the solution was dried in an Ar atmosphere and heated at 300° C. under $10^{-4}$ Pa to be polymerized, thereby forming the first organic layer 16 consisting of a polyparaphenylenevinylene film having a thickness of 2 $\mu$m.

In this organic field effect element, a relationship between a potential vd of the drain electrode with respect to the source electrode and a current Id flowing in the drain electrode is shown in FIG. 4 using a potential Vg of the gate electrode with respect to the source electrode as a parameter. As is apparent from FIG. 4, it is found that the current Id is controlled by the potential Vg. A preferable organic field effect element having a large ON current and a very large ratio of the ON current to an OFF current was obtained.

Example 2

FIG. 5 is a sectional view showing a liquid crystal display using an organic field effect element having the same arrangement as that of the organic field effect element in Example 1. A gate electrode 12 formed on a glass substrate 11 is connected to an address line 21. A source electrode 14 and a drain electrode 15 formed on the gate electrode 12 through a second organic layer 13 are connected to a data line 22 and a pixel electrode 23 consisting of ITO, respectively. A first organic layer 16 is formed on the source electrode 14 and the drain electrode 15, and an insulating layer 24 consisting of polyimide is formed on the first organic layer 16 by deposition to protect the entire surface of the organic field effect element. A counter electrode 26 consisting of ITO and an insulating layer 27 are formed on a glass substrate 25 opposite to the glass substrate 11. The glass substrates 11 and 25 are caused to oppose each other by a normal method to form a liquid crystal cell, and a liquid crystal 28 is sealed between both the substrates. A rubbing process is performed to the insulating layers 24 and 27 consisting of polyimide.

The response of this liquid crystal display was examined as follows. While potentials of 0 V and −6 V were kept applied to the data line (source electrode) and the counter electrode, respectively, a potential of −30 V was applied to the address line, and then a potential of 0 V was applied thereto. The liquid crystal was rapidly turned on in response to the potential of −30 V without any delay, and this ON state was kept. On the other hand, while potentials of −12 V and −6 V were kept applied to the data line (source electrode) and the counter electrode, respectively, a potential of −30 V was applied to the address line, and then a potential of 0 V was applied thereto. The liquid crystal was rapidly turned off in response to the potential of −30 V without any delay, and this state was kept.

In Example 2, carriers are positively charged. In this case, when the potential of the gate electrode (address line) is set to be lower than the potential of either the source electrode (data line) or the drain electrode (pixel electrode), which has a higher potential, the carriers flow from one (the substantial source electrode) of the source and drain electrodes which has a higher potential, to the other (the substantial drain electrode) of the source and drain electrodes, which has a lower potential. The ON and OFF states are controlled by an electric field formed by the charges.

On the other hand, assume that the carriers are negatively charged. When the potential of the gate electrode (address line) is set to be higher than the potential of either the source electrode (data line) or the drain electrode (pixel electrode), which has a lower potential, the carriers flow from one (the substantial source electrode) of the source and drain electrodes which has a lower potential to the other (the substantial drain electrode) of the source and drain electrodes which has a higher potential. The ON and OFF states are controlled by an electric field formed by the charges.

When these conditions are satisfied, the potentials of the address line, the data line, and the counter electrode can be arbitrarily set.

Example 3

Figure 6:
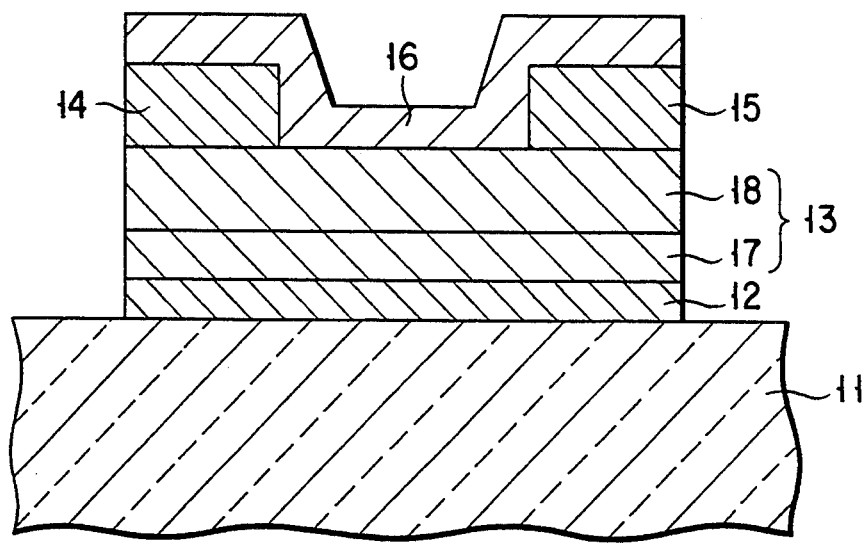
FIG. 6 is a sectional view showing an organic field effect element according to Example 3 of the present invention.

FIG. 6 is a sectional view showing an organic field effect element according to Example 3. A gate electrode 12 is formed on a glass substrate 11, a charge generation layer 17 is formed to cover the entire surface of the gate electrode 12, and a charge transport layer 18 is formed on the charge generation layer 17. The charge generation layer 17 and the charge transport layer 18 constitute a second organic layer 13. A source electrode 14 and a drain electrode 15 are separately formed on the second organic layer 13, and a first organic layer 16 is formed to constitute a channel between the source and drain electrodes 14, 15.

This organic field effect element was manufactured as follows. A polysilane derivative used for the charge transport layer was synthesized in advance. The polysilane derivative was synthesized in accordance with a method described by J. Devzux et al., European Polymer Journal, Vol. 25, No. 3, pp. 263–266 (1989). That is, Na was mixed in toluene and refluxed, and phenylmethyldichlorosilane serving as a monomer was introduced in the toluene to be polymerized. After the reaction was finished, the Na was treated with ethanol, solid products (polysilane having a phenyl group and a methyl group as substitutent groups) was recovered, washed with deionized water, and dried.

An Al film which was so thin that the film was transparent was vacuum-deposited on the glass substrate 11, thereby forming the gate electrode 12. An X-type non-metallic phthalocyanine was dispersed in a trichloroethane solution containing 2 wt % of a phenoxy resin (a weight ratio of the phthalocyanine to the resin is 1:1), and the resultant solution was coated by a spinner and dried, thereby forming the charge generation layer 17 having a thickness of 200 nm. A solution obtained by dissolving the above polysilane derivative in toluene was coated on the charge generation layer and then dried, thereby forming the charge transport layer 18 having a thickness of 5 $\mu$m. A metal mask was fixed on the second organic layer 13 consisting of the charge generation layer 17 and the charge transport layer 18, and Au was deposited on the resultant structure by electron beam deposition, thereby forming the source electrode 14 and the drain electrode 15. The space between the source electrode 14 and the drain electrode 15 was set to be 50 $\mu$m.

$(Bu)_4N^+ClO_4^-$ (Bu is a butyl group) serving as an electrolyte and pyrrole serving as a monomer were added to a solution mixture of 99 vol % of well-refined acetonitrile and 1 vol % of distilled water to have concentrations of 0.1 mol % and 0.05 mol %, respectively. The source and drain electrodes and a Pt plate were used as working electrodes and a counter electrode, respectively, and a potential of 3.5 V was applied such that the working electrodes had a positive potential with respect to the counter electrode. In this manner, the above materials were electrochemically polymerized at a constant current having a current density of 0.2 mA/cm$^2$ for 10 minutes to stack a polypyrrole layer having a thickness of 200 nm, thereby forming the first organic layer 16. In this state, however, since the polypyrrole layer was set in a metallic state doped with $ClO_4^-$ ions, the working electrodes were kept at a potential of −2 V for an hour with respect to the counter electrode so as to set a current flowing in the working electrodes at 0 A. The resultant structure was exposed to an ammonia vapor to undope ions. In addition, the resultant structure was left under a vacuum of $10^{-4}$ Pa at 150° C. for about 3 hours.

When the organic field effect element is irradiated with light, carriers are generated in the charge generation layer constituting the second organic layer, and the carriers are injected in the charge transport layer constituting the second organic layer. At a time when the carriers are injected in the first organic layer across the charge transport layer, a current begins to flow in the channel. A time interval from when the element is irradiated with light to when the current flows in the channel is determined by the carrier mobility and thickness of the charge transport layer. The magnitude of the current depends on the intensity of the light and the generation efficiency of the carriers of the charge generation layer. There is a merit that these values can be set to be desirable values. In addition, as the characteristic feature of the organic field effect element, for example, serial current signals are generated in response to, parallelly transferred light signals.

Figure 7:
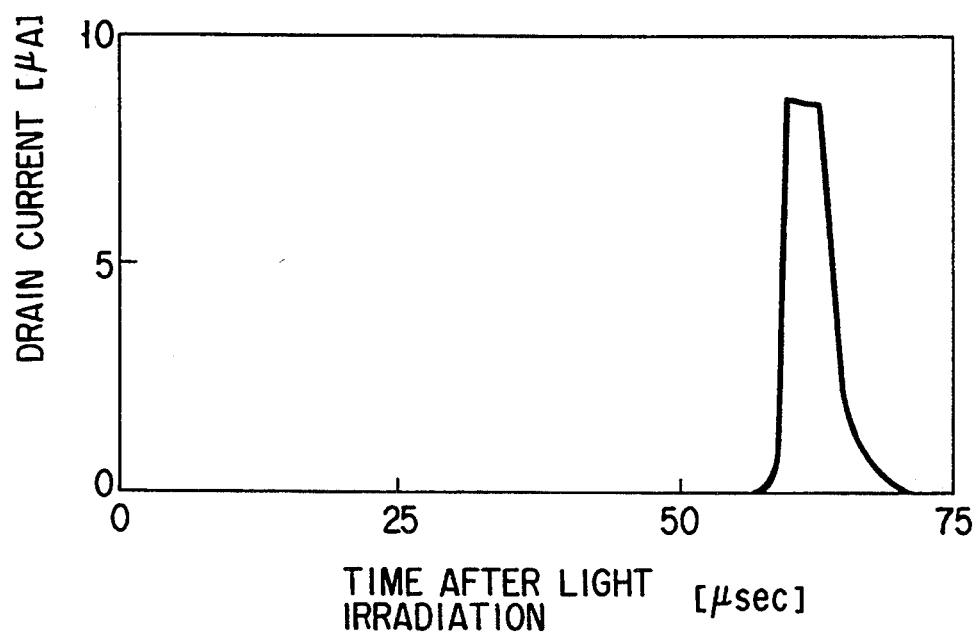
FIG. 7 is a graph showing a response of a drain current to an irradiation of the light of a Xe flush lamp having a pulse width of 5 $\mu$sec from the gate electrode side of the organic field effect element according to Example 3 of the present invention, under the condition where voltages of $-5$ V and $-50$ V are applied to the drain and gate electrodes with respect to the source electrode, respectively.

FIG. 7 shows the response of a drain current when the element is irradiated with the light of a Xe flush lamp having a pulse width of 5 $\mu$sec from the gate electrode side under the condition where voltages of $-5$ V and $-50$ V are applied to the drain and gate electrodes with respect to the source electrode, respectively. As is apparent from FIG. 7, this element is an excellent element having a large ratio of a current (ON current) in an light irradiation state to a current (OFF current) in a non-irradiation state.

In addition, when the organic field effect element is applied to a liquid crystal display, the ON and OFF states of the liquid crystal display can be controlled by light irradiation.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An organic field effect element comprising:
   a source electrode and a drain electrode formed separately to each other;
   a first organic layer constituting a channel between said source and drain electrodes;
   a second organic layer formed to be adjacent to said channel and having a carrier concentration higher than that of said first organic layer; and
   a gate electrode formed to be adjacent to said second organic layer and opposite to said channel,
   wherein carriers are transferred between said second and first organic layers in response to a voltage applied to said gate electrode to change an electrical conductivity of said channel.

2. The element according to claim 1, wherein materials of said first organic layer constituting said channel and said second organic layer formed to be adjacent to said channel are selected from the group consisting of a $\pi$-conjugated polymer, a $\sigma$-conjugated polymer, and derivatives thereof.

3. The element according to claim 2, wherein said second organic layer contains a dopant selected from the group consisting of a halogen, a Lewis acid, a protonic acid, an organic acid, amino acid, a transition metal compound, and an anion.

4. The element according to claim 2, wherein said second organic layer contains a dopant selected from the group consisting of a cation, an alkali metal, an alkaline earth metal, $O_2$, $XeOF_4$, $(NO_2^+)(SbF_6^-)$, $(NO_2^+)(SbCl_6^-)$, $(NO_2^+)(BF_4^-)$, $AgClO_4$, $H_2IrCl_6$, $La(NO_3)_3 \cdot 6H_2O$, $FSO_2OOSO_2F$, Eu, acetylcholine, $R_4N^+$ (R is an alkyl group), $R_4P^+$ (R is an alkyl group), $R_6As^+$ (R is an alkyl group), and $R_3S^+$ (R is an alkyl group).

5. The element according to claim 1, wherein a carrier concentration N in said second organic layer satisfies a condition of $N > 55{,}000\ \epsilon/d^2$ where d is a thickness and $\epsilon$ is a permittivity of said second organic layer.

6. The element according to claim 2, wherein the $\pi$-conjugated polymer is selected from the group consisting of polyparaphenylene, polyacetylene, polypyrrole, polythiophene, polyfuran, polyselenophene, polyaniline, polyazulene, polypyrene, polyfluorene, polyparaphenylenevinylene, polythienylenevinylene, polybenzofuran, polybenzothiophene, polyindole, polyvinylcarbazole, polydibenzofuran, polyisothianaphthene, polyisonaphthothiophene, polydiacethylene, polyphenylenesulfide, and polyphenyleneoxide.

7. The element according to claim 2, wherein the $\sigma$-conjugated polymer is selected from the group consisting of polysilane and polygermane.

8. An organic field effect element comprising:
   a source electrode and a drain electrode formed separately to each other;
   a first organic layer constituting a channel between said source and drain electrode;
   a second organic layer having a stacked structure consisting of a charge transport layer and a charge generation layer formed to be adjacent to said channel, a carrier concentration of said second organic layer being higher than that of said first organic layer when light is irradiated on said second organic layer; and
   a gate electrode formed to be adjacent to said second organic layer and to be opposite to said channel,
   wherein carriers are transferred between said second and first organic layers in response to a voltage applied to said gate electrode to change an electrical conductivity of said channel.

9. The element according to claim 8, wherein said charge generation layer contains a material selected from the group consisting of an inorganic photoconductor, metallic phthalocyanine, non-metallic phthalocyanine, an azo dye, a penylene pigment, a polycyclic quinon pigment, an aggregate complex, and a charge transfer complex.

10. The element according to claim 8, wherein said charge transport layer contains a material selected from the group consisting of a $\pi$-conjugated polymer, a $\sigma$-conjugated polymer, and derivatives thereof.

11. The element according to claim 8, wherein said charge transport layer contains a material selected from the group consisting of a hydrazone compound, a pyrazoline compound, an oxadiazole compound, a thiazole compound, a thiadiazole compound, a ketazine compound, an enamine compound, an anisidine compound, a stilbene compound, a butadiene compound, a carbazole compound, and polymer compounds obtained by introducing residual groups thereof to the main or side chains of polymers.

12. The element according to claim 1, wherein a material of said gate electrode is selected from materials which can form a Schottky junction or a heterojunction with said second organic layer.

13. The element according to claim 12, wherein a material of said gate electrode is selected from a metal, a conductive oxide, a semiconductor, a $\pi$-conjugated polymer, a σ-conjugated polymer, and derivatives of the π-conjugated and the σ-conjugated polymers.

14. The element according to claim 1, wherein materials of said source and drain electrodes are selected from materials which can form a Schottky junction or a heterojunction with said second organic layer.

15. The element according to claim 14, wherein materials of said source and drain electrodes are selected from a metal, a conductive oxide, a semiconductor, a π-conjugated polymer, a σ-conjugated polymer, and derivatives of the π-conjugated and the σ-conjugated polymers.

16. A liquid crystal display comprising two substrates arranged to be opposite to each other, a pixel electrode and a drive element formed on an inner surface of one substrate, a counter electrode formed on an inner surface of the other substrate, and a liquid crystal sealed between said substrates,
wherein said drive element includes
a source electrode and a drain electrode formed separately to each other;
a first organic layer constituting a channel between said source and drain electrodes;
a second organic layer formed to be adjacent to said channel and having a carrier concentration higher than that of said first organic layer; and
a gate electrode formed to be adjacent to said second organic layer and to be opposite to said channel,
wherein carriers are transferred between said second and first organic layers in response to a voltage applied to said gate electrode to change an electrical conductivity of said channel.

* * * * *